United States Patent [19]
Matsumoto et al.

[11] Patent Number: 4,922,377
[45] Date of Patent: May 1, 1990

[54] MODULE AND A SUBSTRATE FOR THE MODULE

[75] Inventors: Kunio Matsumoto; Takanobu Noro; Naoya Kanda, all of Yokohama, Japan

[73] Assignee: Hitachi, Ltd., Tokyo, Japan

[21] Appl. No.: 271,677

[22] Filed: Nov. 16, 1988

[30] Foreign Application Priority Data

Nov. 16, 1987 [JP] Japan .................................. 62-287391
Mar. 4, 1988 [JP] Japan .................................. 63-49663

[51] Int. Cl.⁵ .............................................. H05K 7/20
[52] U.S. Cl. ..................................... 361/387; 361/414
[58] Field of Search ................................ 361/414, 387

[56] References Cited
U.S. PATENT DOCUMENTS 4,706,165 11/1987 Takenaka et al. ..................... 361/414

Primary Examiner—Roy N. Envall, Jr.
Attorney, Agent, or Firm—Antonelli, Terry & Wands

[57] ABSTRACT

This invention relates to a module which mounts a plurality of semiconductor devices and to a module substrate that interconnect the semiconductor devices.

This invention has the testing and engineering change pads on the underside of the substrate. This arrangement results in the advantages of: providing a sufficient area for the testing and engineering change pads; improving the package density of semiconductor devices, which in turn leads to higher computation speed; and eliminating the need for a special cooling system during the module testing, simplifying the process of testing. Furthermore, since the signal joint terminals to the semiconductor chips are provided on the surface of the substrate on which the semiconductor chips are mounted and since the power bus joint terminals are provided around the chips on the semiconductor chip-mounting surface of the substrate, it is possible to realize a high density package with high reliability.

15 Claims, 4 Drawing Sheets

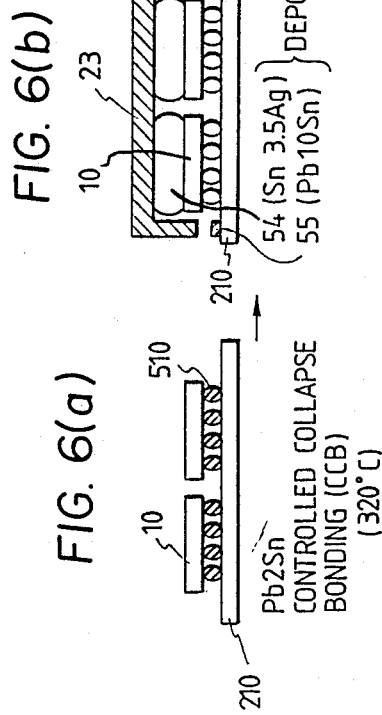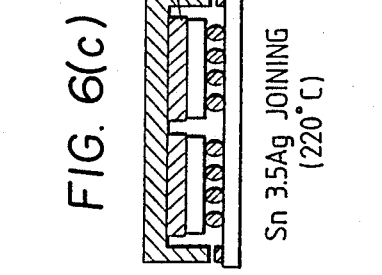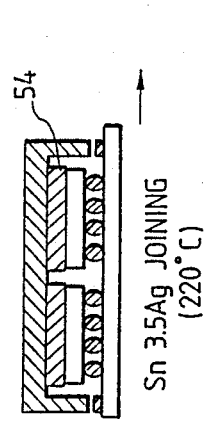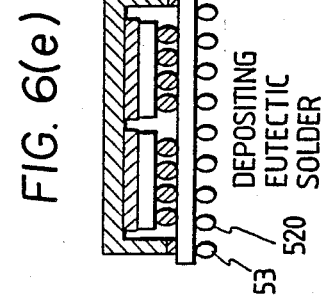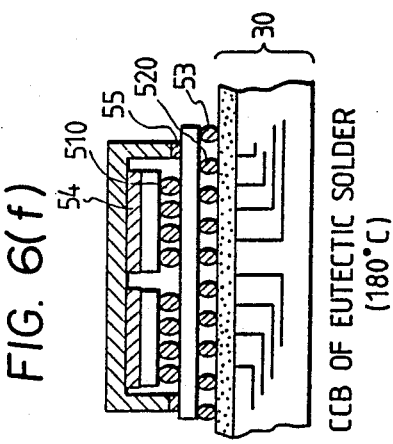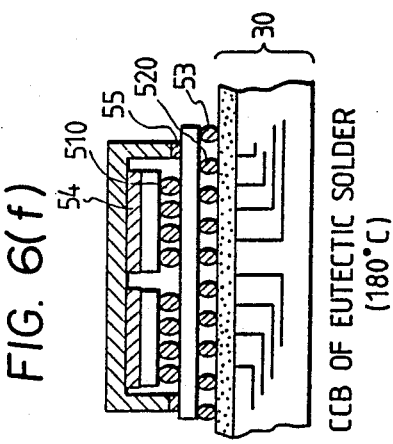

MODULE AND A SUBSTRATE FOR THE MODULE

BACKGROUND OF THE INVENTION

This invention relates to a module for mounting a plurality of semiconductor devices (hereinafter referred to as LSI chips), and to a module substrate that interconnects the LSI chips.

A conventional example of a module substrate that interconnects a plurality of LSI chips (or simply referred to as chips) may be found in the U.S. Pat. No.4,302,625.

In this conventional example of a multi-layer ceramic substrate that interconnects LSI chips, testing and engineering pads are provided to the top surface on which the chips are mounted (simply referred to as the top surface of the substrate) and input/output pins and power supply pins are mounted to the underside of the substrate opposite to the chip-mounting surface (simply referred to as the underside of the substrate). This substrate also has a cooling means thermal-joined to the back of the chips to cool the chips.

In the above conventional module substrate, the testing and engineering change pads are arranged on the substrate surface around the circumference of the LSI chips in almost the same number as the chip input/output terminals. The penalty of this configuration is that in the LSI chips tending to have a greater number of terminals the package density of the chips must be made a sacrifice to secure the area for the testing and engineering change pads.

During module testing, a cooling means that is thermal-joined to the back of the chips must be removed to allow a testing probe to be connected to the testing and engineering change pads. And a special cooling system for testing that will not hinder the connection of the testing probe should be installed in place of the removed cooling means.

Recently, large computers employ chips with very high circuit integration of about 2000 gates per chip. They have high power consumption of 6W/chip and a large number of connecting points or joints of 160 points/chip. The trend for higher circuit integration of chips is notable, with the circuit density increasing three or four times in four years. It is therefore expected that in future computers there will be greater demands for chips with large power consumption and increased number of joints and that the conventional technique will reach a limit in (1) the cooling ability and (2) the number of joints and thus will not be able to cope with requirements for higher package density.

SUMMARY OF THE INVENTION

A primary object of the present invention is to provide a module and a module substrate used for the module, which clear two problems (1) reduced chip package density resulting from securing an area for the testing and engineering pads; and (2) the necessity of using a cooling system for module testing.

A second object of the invention is to provide a module that can (1) improve the cooling ability and (2) accommodate an increased number of joints and thereby improve the bonding efficiency.

The first object can be achieved in the present invention by providing the testing and engineering change pads on the underside of the substrate.

By placing on the underside of the substrate the testing and engineering change pads that have conventionally been arranged on the chip-mounting surface of the substrate around the periphery of the LSI chip, an area available for the pads increases by as much as the chip-mounting area, allowing an increased number of testing and engineering change pads to be accommodated. This makes it possible to mount the LSI chips with greater density while securing a sufficient number of testing and engineering change pads. Another advantage is that during module testing, the testing probe can be connected to the testing and engineering change pads from the underside of the substrate, which eliminates the need to remove the cooling means thermal-joined to the back of the chips and therefore requires no special cooling system for testing.

The second object is achieved in the present invention by placing input/output joint terminals to the semiconductor chips on the chip-mounting surface of the substrate and by arranging power bus joint terminals around the chips on the chip-mounting surface of the substrate.

The arrangement of the power bus joint terminals around the chips on the chip-mounting surface of the substrate allows the underside to be used only for input/output joints, which increases the joint-to-joint space thereby improving the bonding efficiency. Furthermore, in mounting a plurality of semiconductor chips on the same chip carrier substrate, it is possible to implement logical joint between these chips through the chip carrier substrate, further reducing the number of input/output joints to about two thirds and improving the efficiency of bonding.

BRIEF DESCRIPTION OF THE DRAWINGS

FIG. 6 shows the sequence of assembling the module of the second embodiment.

DETAILED DESCRIPTION OF THE PREFERRED EMBODIMENTS

First, we will describe the module according to the first embodiment of the invention. Features of this embodiment are listed below and each of them will be explained in detail.

(1) The module of this invention consists of a multi-layer wiring substance which has input/output terminals, power supply terminals, and testing and engineering change pads; and a plurality of LSI chips mounted on the substrate and having a cooling means on their back. The LSI chips with the cooling means on their back are electrically and mechanically connected to the top surface of the multi-layer wiring substrate through chip joints. On the substrate surface around the chips, power supply terminals are arranged through power bus joints. On the underside of the multi-layer wiring substrate are arranged input/output terminals and a pattern of testing and engineering change pads, both connected to the LSI chips.

(2) The testing and engineering change pads are connected, through the multi-layer wiring substrate, with wiring that connect to the corresponding input/output terminals of the semiconductor LSI chips and also with wiring that electrically interconnect adjacent LSI chips.

(3) The testing and engineering change pad pattern is provided on the main area of the underside of the multi-layer wiring substrate and the input/output terminals are arranged on the periphery of the underside.

Next, features of the module substrate according to this embodiment will be listed below and explained in detail.

(1) The module substrate has power supply terminals on the semiconductor LSI-mounting surface around the chips. On the underside of the module substrate, testing and engineering change pad pattern and input/output terminals are provided. The module substrate is composed of a multi-layer wiring structural body which contains at least wiring from the LSI chip electrodes connected to the testing and engineering change pad pattern and wiring electrically interconnecting the adjacent LSI chips.

(2) Connected to the testing and engineering change pads are wiring that are connected to the corresponding input terminals of the semiconductor LSI chip and wiring that electrically interconnect the adjacent LSI chips.

(3) A group of input/output terminals are provided around the testing and engineering change pad pattern.

(4) The multi-layer wiring structural body consists at least of three layers stacked together—a power supply layer, a signal input/output layer, and a ground layer.

(5) The multi-layer wiring structural body consists of laminated ceramic layers to which wiring patterns are applied.

Now, by referring to FIGS. 1 and 2 the first embodiment of the invention will be described in detail.

Figure 1:
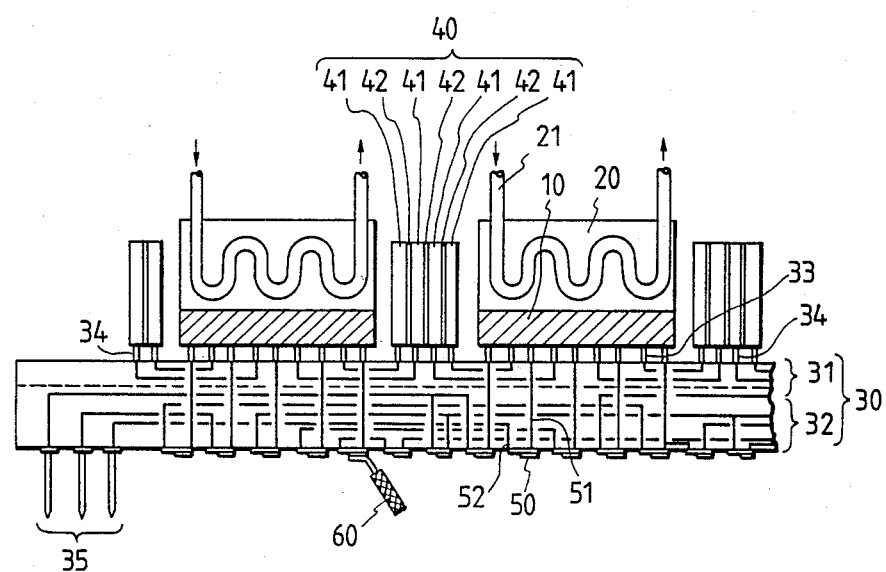
FIG. 1 is a cross section of a module as the first embodiment of the invention with testing and engineering change pads installed on the underside of a module substrate.

FIG. 1 is a cross section of a multi-chip module as one embodiment of the invention. FIG. 2 is a perspective view of the module.

Figure 2:
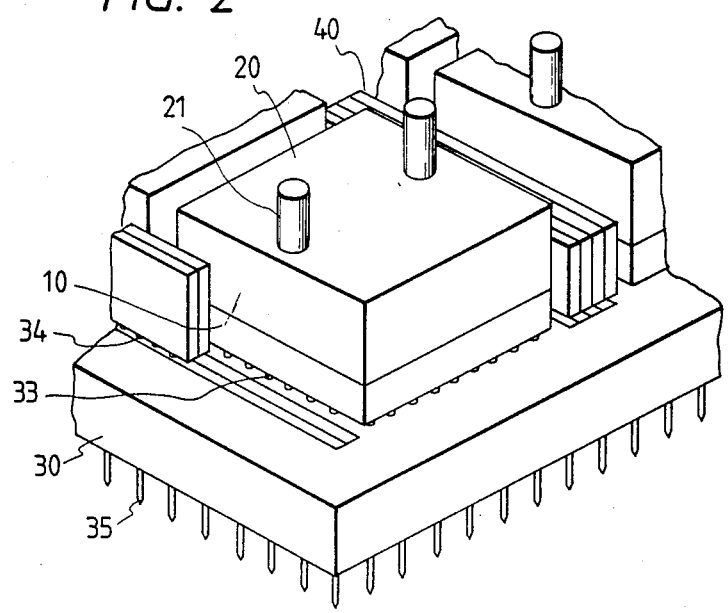
FIG. 2 is a perspective view of the module of FIG. 1.

In FIGS. 1 and 2, reference numeral 10 denotes a large-scale integrated circuit chip or LSI chip; 20 a cooling block to cool the chip 10; 21 a coolant passage formed in the cooling block 20; 40 a power bus, of which 41 signifies power supply conductors for applying different voltage and 42 insulting layers for insulating the power supply conductors 41 from each other; 30 a module substrate; 33 chip joints to connect the chip 10 to the module substrate 30; 34 a power bus joint to connect the power supply conductors 41 to the module substrate 30; 31 a power supply layer to the chip 10; 32 a wiring layer to interconnect the chips 10; 50 testing and engineering change pads installed on the underside of the module substrate 30; 51 layer-piercing conductors to lead the signal lines of the chip 10 to the testing and engineering change pads 50; 52 part-through conductor to connect the testing and engineering change pads 50 to the wiring layer 32; 35 input/output pins for signal connection with other modules or external circuits; and 60 testing and engineering change wires attached to the testing and engineering change pads 50.

As is seen from FIGS. 1 and 2, placing the testing and engineering change pads 50 on the underside of the substrate permits higher integration of the chip 10 by 40 to 50% than is possible with the conventional arrangement where the pads 50 are installed around the chip 10. Further, during testing the testing probe can be connected to the substrate from the underside, which allows the module to be tested as it is assembled. This in turn eliminates the need to prepare for a special cooling system for testing. Moreover, the testing and engineering change pads 50 that are arranged in a plane makes the positioning of the testing probe easy. These advantages will also makes easy the connection of the engineering change wire 60.

In this embodiment, the input/output pins 35 are arranged on the periphery of the module substrate 30 and the power supply system is mounted on the top surface of the substrate as the power bus 40, in order to install the testing and engineering change pads 50 on the underside of the substrate.

With this embodiment, the integration density of the LSI chips can be improved while securing a sufficient area for the testing and engineering change pads, resulting in an improvement in the module functions such as higher computation speed. Another advantage brought about by this embodiment is that a special cooling system is not required for the testing of the module, contributing to a simplified testing procedure.

Next, the second embodiment of this invention will be described with reference to the accompanying drawings.

Figure 3:
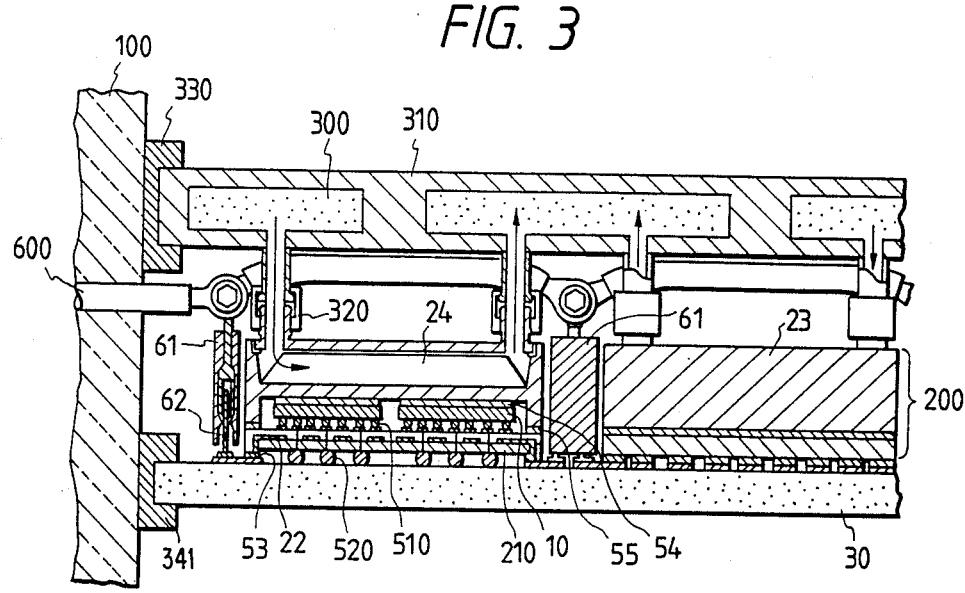
FIG. 3 is a cross section of a module as the second embodiment of the invention, showing the arrangement of external electrode terminals provided on the underside of the chip carrier substrate, in which input/output joint terminals are put on the main area of the underside with power bus joint terminals arranged on the periphery of the underside of the chip carrier substrate.
Figure 4:
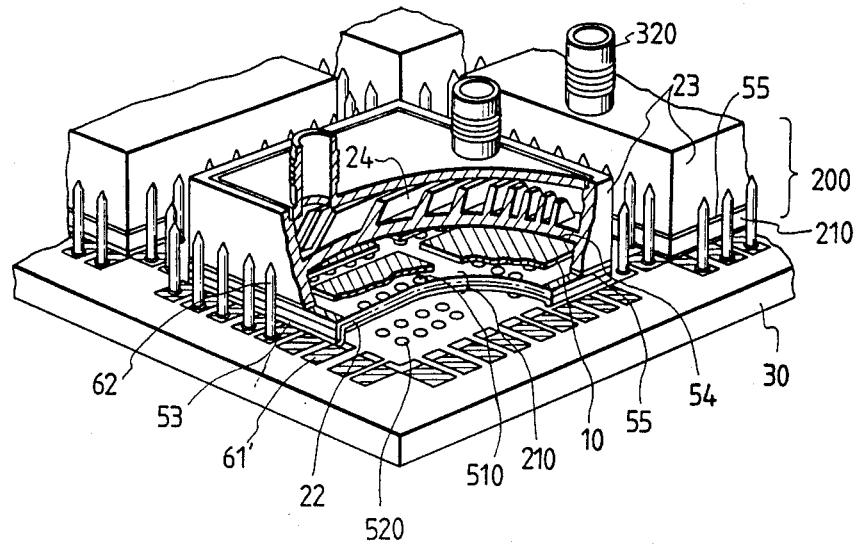
FIG. 4 is a perspective view, partly cut away, of essential portions of the module of FIG. 3.

FIG. 3 is a cross section illustrating the outline of this embodiment. FIG. 4 is a partly cutaway perspective view of an essential part of FIG. 3. Reference numeral 10 signifies a semiconductor LSI chip (simply referred to as a chip); 200 a chip carrier that can mount a plurality of chips 10 (in the case of the drawing, four) and consists of a chip carrier substrate 210 and a heat transfer sealing block 23. Denoted 210 is a chip carrier substrate that electrically interconnects a plurality of chips 10, integrates common power supply circuits into a layer by internal through holes and interconnecting wires, and accomplishes logical joints (not shown) between the chips 10. Designated 22 is a power supply layer that is contained in the chip carrier substrate 210 and into which common power supply circuits are integrated. 23 is a heat transfer sealing block that protects the chip 10 from external environments and is thermally joined to the chips 10 to dissipate heat. 24 is fins formed in the heat transfer sealing block 23; 300 is cooling water as a coolant; 310 a cooling water passage to introduce the cooling water 300 into the chip carrier 200; 320 a water connector to connect the cooling water passage 310 to the chip carrier 200; 330 a cooling water passage support to mechanically support the cooling water passage 310; 30 a multi-layer wiring substrate that forms an integrated functional unit by interconnecting a plurality of chip carriers 200 through logical joints (not shown); 341 a substrate support to mechanically support the entire substrate 30; 54 a thermal joint that connects the chips 10 and the heat transfer sealing block 23 by solder to dissipate heat from the chips 10; 55 a chip seal that joins the heat transfer sealing block 23 and the chip carrier substrate 210 by solder to protect the chips 10 from external environments; 510 chip joints that connect the chips 10 to the chip carrier substrate 210 by flip chip bonding; 520 signal joints to make logical connections between the chip carriers 200 through substrate 30; 53 power bus joints that feed, from outside through the surface of the substrate 30, the common power supply circuits integrated into the power supply layer 22 in the chip carrier substrate 210 and which secures the chip carrier 200 to the substrate 30 by solder; 62 power supply pins that feed the chip carrier substrate 210 from outside through the power bus joints 53; 61' power supply pads on the substrate 30; 61 connectors that mate with the corresponding power supply pins 62; 600 a power supply line that feeds power to each chip carrier 200 through the connectors 61; and 100 a frame to support the whole substrate structure.

As can be seen from the construction described above, since the back of the chip 10 is soldered to the finned heat transfer sealing block 23, the module has a good cooling ability, capable of cooling chips which have a high power consumption per chip of 20 to 30W to a sufficient level. The use of flip chip bonding enables simultaneous connection of a number of chip joints 510 of the chip 10. To reduce the number of connecting points with the substrate 30, the chip carrier substrate 210 has the common power supply circuits integrated into the power supply layer 22 and also has the power bus joints 53 arranged on the periphery of the chip carrier substrate 210. In addition, the chip carrier substrate 210 can interconnect the mounted chips 10 through logical joints, which helps reduce the number of signal joints 520 to the substrate 30. In this way, the use of the chip carrier substrate 210 enables efficient mounting and interconnection of the chips 10 with a large number of connecting points.

While in this embodiment we took as example a chip carrier 200 that can carry four chips 10, the number of chips mounted on the carrier may be otherwise. The coolant may also be other than water.

Figure 5A:
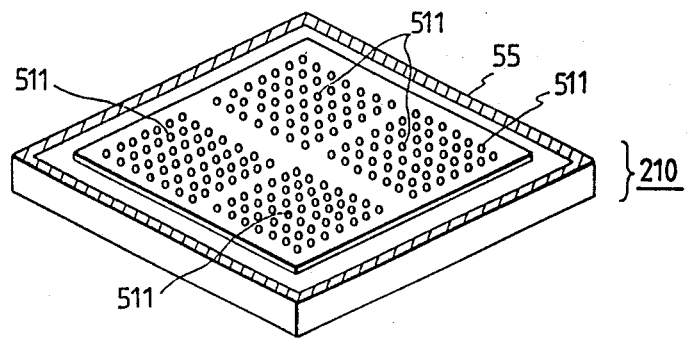
FIGS. 5(a) to 5(c) show the construction of the chip carrier substrate, a constitutional element of the second embodiment.
Figure 5B:
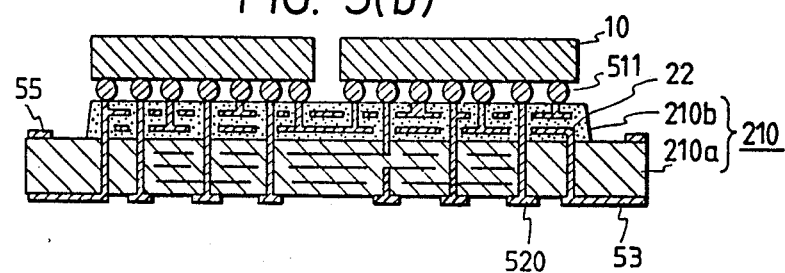
Figure 5C:
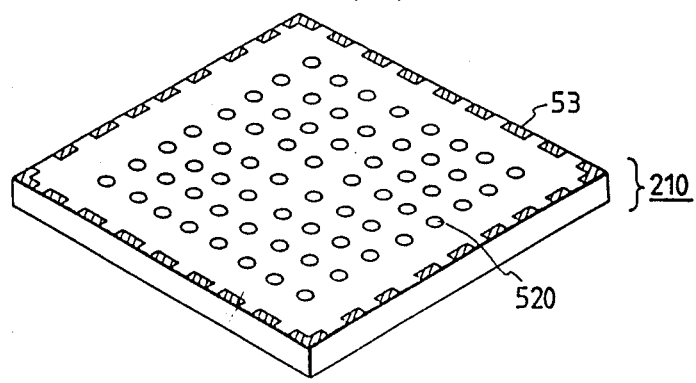

FIG. 5 shows more details of the chip carrier substrate 210. FIG. 5(a) is a perspective view, as seen from above, of the chip carrier substrate showing the top on which chips are mounted; FIG. 5(b) a cross section; and FIG. 5(c) is a perspective view of the chip carrier substrate, showing the underside.

In FIG. 5(a) reference numeral 510 represents electrode pads forming the chip joints. In this example, a pad pattern 511 to which four chips are connected is shown. Denoted 55 is a chip seal on which solder is placed and to which the heat transfer sealing block 23 is secured to seal the chips 10. FIG. 5(b) shows the cross section of the chip carrier substrate on which the chips 10 are mounted, with the chip joints 510 electrically connected through solder to the electrode pads (not shown) by flip chip bonding. The interior of chip carrier substrate 210 is formed as a multi-layer wiring structural body. Layers of wiring network are interconnected via through holes. In this example the chip carrier substrate 210 consists of two substrates. A lower substrate forms a base 210a which is a multi-layer wiring substrate with ceramic insulating layers formed of alumina and mullite (conductors are formed of tungsten). Stacked on this base 210a is another multi-layer wiring substrate 210b with the insulating layers between the conducting layers formed of a heat resistant organic material such as polyimide (power supply conductors are made of copper or aluminum) to form three-dimensional circuits. The circuits contain signal lines, power supply lines and earth lines, so arranged as to permit a logical joint between a plurality of chips 10. FIG. 5(c) shows the underside of the chip carrier substrate. The chip carrier substrate 210 has power bus joints (power supply terminals) 53 along the periphery of the underside and, inside the power bus joints, signal joints (signal terminals including earths terminals) 520 arranged in columns and rows to form an electrode pattern that corresponds to a pad pattern on the multi-layer wiring substrate 30 of FIG. 4. The signal joints 520 of the chip carrier substrate 210 are connected to the electrode pads on the substrate 30 by flip chip bonding. Although in the example of FIG. 5(c) the power bus joints 53 are provided along the entire circumference of the underside of the chip carrier substrate, this is shown as one preferred example and it is possible to lay these joints 53 locally on one side only or on two or three sides. What is important is to put the signal joints 520 in the main area on the underside and the power bus joints (power supply terminals) 53 on the periphery.

FIG. 6 shows the process of mounting the semiconductor chips, with the essential part of the solder joints illustrated in a simplified form. In FIG. 6(a), the chips 10 are mounted to the chip carrier substrate 210 through solder (Pb2Sn, at 320° C.) 510. FIG. 6(b) shows solder (Pb10Sn) deposited on the chip seal 55 of the chip carrier substrate 210 and solder (Sn3.5Ag) deposited between the chips 10 and the heat transfer sealing block 23 to form thermal joints 54 (only essential portions are shown, with fins and the like omitted). And in FIG. 6(c) the thermal joints 54 are soldered (Sn3.5Ag, at 200° C.). Then in FIG. 6(d) the chip seal 55 is soldered (Pb10Sn, at 300° C.). FIG. 6(e) shows eutectic solder deposited at the external electrode terminals 520, 53. And in FIG. 6(f) the chip carrier substrate is positioned on the electrode pads of the multi-layer wiring substrate 30 and then secured to the substrate 30 through eutectic solder at 180° C. by flip chip bonding. Now the chip mounting process is completed.

With this embodiment, it is possible to (1) improve the cooling ability which will soon reach a limit when a conventional chip mounting technique is employed; and (2) increase the number of joints and carry out joint-bonding with high efficiency. This in turn will make it possible to realize higher integration of multi-joint chips with high power consumption in future large computers. Especially when low resistance circuits are used in forming a power bus layer in the chip carrier substrate, the power supply terminals are provided on the periphery of the chip carrier substrate to accommodate the difference in the coefficient of thermal expansion between different materials. This has made it possible to realize high integration with high reliability.

We claim:

1. A module comprising:
 a multi-layer wiring substrate having signal input-/output terminals, power supply terminals, and testing and engineering change pads; and a plurality of large-scale integrated (LSI) circuit semiconductor chips mounted on the substrate, the LSI chips having cooling means on the back; wherein the semiconductor LSI chips are mounted on and electrically connected to the top surface of the multi-layer wiring substrate through chip joints, power supply terminals are arranged on the top surface of the substrate around the chips through power bus joints, and on the underside of the multi-layer wiring substrate input/output terminals and a pattern of testing and engineering change pads, both connected to the semiconductor LSI chips, are installed.

2. A module as set forth in claim 1, wherein the testing and engineering change pads are connected through the multi-layer wiring substrate with wiring which are connected to the corresponding input/output terminals of the semiconductor LSI chips and also with wiring that electrically interconnect adjacent LSI chips.

3. A module as set forth in claim 1, wherein the testing and engineering change pad pattern is provided on the major area of the underside of the multi-layer wiring substrate, and the input/output terminals are arranged around testing and engineering change pad pattern.

4. A module substrate formed of a multi-layer wiring structure, comprising:
   power supply terminals provided on an LSI chip-mounting surface of the substrate around semiconductor LSI chips;
   a pattern of testing and engineering change pads provided on the underside of the substrate opposite to the LSI chip-mounting surface;
   input/output terminals provided on the underside of the substrate where the testing and engineering change pads are formed;
   internal wiring from the LSI chips connected at least to the testing and engineering change pad pattern; and
   internal wiring to electrically interconnect adjacent LSI chips.

5. A module substrate as set forth in claim 4, wherein the testing and engineering change pads are connected with wiring that are connected to the corresponding input/output terminals of the semiconductor LSI chips and also with wiring that electrically interconnect adjacent LSI chips.

6. A module substrate as set forth in claim 4, wherein the input/output terminals are provided around the pattern of testing and engineering change pads.

7. A module substrate as set forth in claim 4, wherein the multi-layer wiring structure consists of a least three layers stacked together—a power supply layer, a signal input/output layer, and an earth layer.

8. A module substrate as set forth in claim 7, wherein the multi-layer wiring structure is formed of laminated ceramic plates with wiring patterns.

9. A module comprising:
   a chip carrier substrate having semiconductor chips mounted on and electrically connected to the top surface thereof by flip chip bonding, the chip carrier substrate having external electrode terminals on its underside that are electrically connected to the chips through internal conductive wiring; and
   a heat transfer sealing block thermally joined to the back of the semiconductor chips, the heat transfer sealing block having coolant passages formed therein;
   wherein the external electrode terminals provided on the underside of the chip carrier substrate are arranged in such a way that signal joint terminals are placed on the principal area of the underside and that power bus joint terminals are placed on the periphery of the underside.

10. A module as set forth in claim 9, wherein a plurality of semiconductor chips mounted on the chip carrier substrate are logical-joined with each other through conductive wiring in the chip carrier substrate.

11. A module as set forth in claim 9, wherein the external electrode terminals are mechanically and electrically connected to electrode pads on a multi-layer wiring substrate by flip chip bonding; and
   a plurality of modules mounted on the multi-layer wiring substrate are logical-joined with each other through conductive wiring in the multi-layer wiring substrate 12. A module as set forth in claim 11, wherein external power supply means are provided to power supply pads that are formed on power bus joints on the multi-layer wiring substrate.

13. A module as set forth in claim 1, wherein the pattern of testing and engineering change pads are provided only on the underside of the multi-layer wiring substrate.

14. A module substrate as set forth in claim 4, wherein the testing and engineering change pads are provided only on the underside of the substrate.

15. A module substrate as set forth in claim 4, wherein the testing and engineering change pattern is provided on the major area of the underside of the substrate and the input/output terminals are arranged around the testing and engineering change pattern.

* * * * *